(12) United States Patent
Yoshida

(10) Patent No.: US 7,732,766 B2
(45) Date of Patent: Jun. 8, 2010

(54) METHOD FOR MEASURING INFORMATION TRANSFER LIMIT IN TRANSMISSION ELECTRON MICROSCOPE, AND TRANSMISSION ELECTRON MICROSCOPE USING THE SAME

(75) Inventor: Takaho Yoshida, Higashimatsuyama (JP)

(73) Assignee: Hitachi, Ltd., Tokyo (JP)

( * ) Notice: Subject to any disclaimer, the term of this patent is extended or adjusted under 35 U.S.C. 154(b) by 182 days.

(21) Appl. No.: 11/976,719

(22) Filed: Oct. 26, 2007

(65) Prior Publication Data

US 2008/0099677 A1    May 1, 2008

(30) Foreign Application Priority Data

Oct. 30, 2006  (JP) .............................. 2006-294907

(51) Int. Cl.
*G01N 23/00*    (2006.01)
*G21K 7/00*    (2006.01)

(52) U.S. Cl. ..................... 250/311; 250/306; 250/307

(58) Field of Classification Search ................. 250/306, 250/307, 310, 311; 356/450; 702/182
See application file for complete search history.

(56) References Cited

U.S. PATENT DOCUMENTS

| | | | | | |
|---|---|---|---|---|---|
| 3,833,811 | A | * | 9/1974 | Koike et al. | 250/306 |
| 4,376,891 | A | * | 3/1983 | Rauscher et al. | 250/307 |
| 5,300,776 | A | * | 4/1994 | Krivanek | 250/311 |
| 5,453,617 | A | * | 9/1995 | Tsuneta et al. | 250/311 |
| 5,491,005 | A | * | 2/1996 | Hoshino | 257/E21.585 |
| 5,650,621 | A | * | 7/1997 | Tsuneta et al. | 250/311 |
| 5,744,800 | A | * | 4/1998 | Kakibayashi et al. | 250/311 |
| 5,767,521 | A | * | 6/1998 | Takeno et al. | 250/492.2 |
| 6,166,380 | A | * | 12/2000 | Kitagawa et al. | 250/311 |
| 6,566,655 | B1 | * | 5/2003 | Choo et al. | 250/306 |
| 6,570,156 | B1 | * | 5/2003 | Tsuneta et al. | 250/311 |
| 6,759,656 | B2 | * | 7/2004 | Tomita | 250/311 |
| 6,891,158 | B2 | * | 5/2005 | Larson et al. | 250/305 |
| 7,015,469 | B2 | * | 3/2006 | Wang et al. | 250/311 |
| 7,285,785 | B2 | * | 10/2007 | Buijsse et al. | 250/310 |
| 7,435,957 | B2 | * | 10/2008 | Inada et al. | 250/310 |
| 7,453,062 | B2 | * | 11/2008 | Tromp | 250/305 |
| 7,456,399 | B1 | * | 11/2008 | Soderstrom | 250/306 |
| 2002/0011566 | A1 | * | 1/2002 | Nagayama et al. | 250/311 |
| 2004/0169142 | A1 | * | 9/2004 | Yamanaka et al. | 250/310 |
| 2005/0178982 | A1 | * | 8/2005 | Henstra et al. | 250/492.22 |

(Continued)

OTHER PUBLICATIONS

Horiuchi, Shigeo "Principles and Usage of High-resolution Electron Microscope", Kyoritsu Shuppan Co., Ltd., 1998, pp. 146, in Japanese with English translation.

(Continued)

*Primary Examiner*—Jack I. Berman
*Assistant Examiner*—Brooke Purinton
(74) *Attorney, Agent, or Firm*—Stites & Harbison PLLC; Juan Carlos A. Marquez, Esq.

(57) ABSTRACT

A crystal thin film is adopted as a specimen for measurement. A change in the contrast of crystal lattice fringes is measured under a condition that a diffracted wave and other wave are caused to interfere with each other. Thus, an information transfer limit of a transmission electron microscope can be measured quantitatively. Since the measurement is performed with a condition for interference restricted, the information transfer limit of the transmission electron microscope can be quantitatively assessed.

9 Claims, 7 Drawing Sheets

U.S. PATENT DOCUMENTS

2006/0113493 A1* 6/2006 Kabasawa et al. ...... 250/492.21
2006/0151697 A1* 7/2006 Inada et al. ................. 250/310
2006/0175619 A1* 8/2006 Fukuyama et al. ............ 257/79
2006/0219908 A1* 10/2006 Inada et al. ................. 250/310
2008/0067380 A1* 3/2008 Ozawa et al. ............... 250/310
2008/0093551 A1* 4/2008 Tsuneta et al. .............. 250/310

OTHER PUBLICATIONS

Freitag, B. et al., "Breaking the spherical and chromatic aberration barrier in transmission electron microscopy", Ultramicroscopy, vol. 102, 2005, pp. 209-214.

* cited by examiner

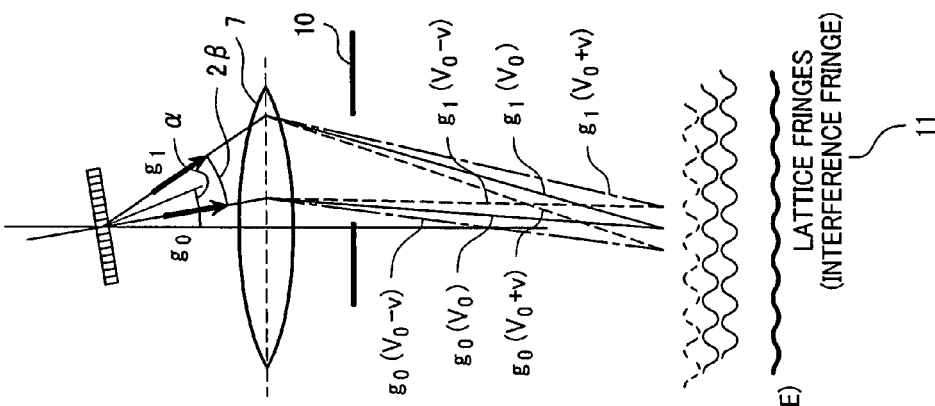
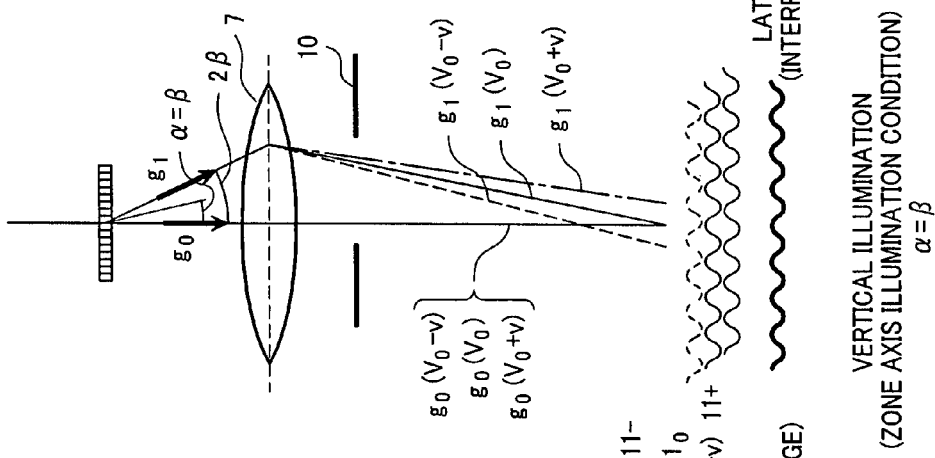
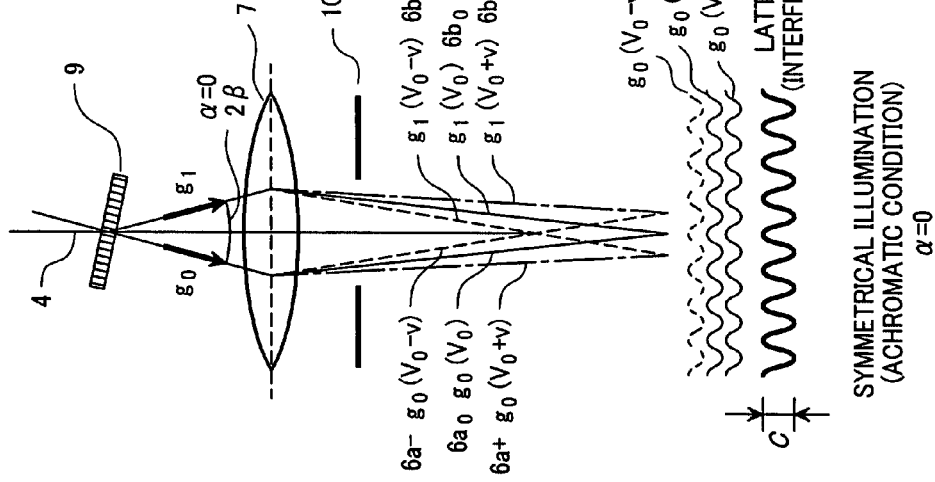

METHOD FOR MEASURING INFORMATION TRANSFER LIMIT IN TRANSMISSION ELECTRON MICROSCOPE, AND TRANSMISSION ELECTRON MICROSCOPE USING THE SAME

CLAIM OF PRIORITY

The present invention claims priority from Japanese application JP 2006-294907, filed on Oct. 30, 2006, the content of which is hereby incorporated by reference on to this application.

BACKGROUND OF THE INVENTION (1) Field of the Invention

The present invention relates to a technique for assessing the performance of a transmission electron microscope or a method for measuring an information transfer limit that is a major factor for determining a spatial resolution offered by an electron microscope, and a transmission electron microscope to which the measuring method is adapted.

(2) Description of the Related Art

In transmission electron microscopes, a resolution is the most important index of performance. The resolution falls into multiple different definitions such as a point resolution, a lattice resolution, and an information transfer limit that are conventionally used for different purposes.

Among the definitions, the point resolution refers to a resolution that provides a limit to which the structure of an observational entity such as an atomic structure in a specimen can be visualized correctly. When it says that the structure can be visualized correctly, it means that the changes in the phase and amplitude of an electron beam occurring when the electron beam passes through a specimen can be correctly reproduced on an image formation plane. If we observe an entity smaller than the point resolution, the phase of an electron beam cannot be correctly reproduced due mainly to spherical aberration caused by an objective lens. Consequently, the point resolution is the direct index of performance from the viewpoint of observing the structure of an observational entity.

In contrast, the information transfer limit refers to a limit of a resolution determined when the contrast of an electron beam (that is, a difference in the intensity=|amplitude|$^2$ of an electron beam) is damped due to the incoherency of the electron beam caused by energy dispersion or angular dispersion.

In normal electron microscopes, the point resolution is larger than the information transfer limit. Therefore, when a specimen is observed using an electron beam that provides a spatial frequency equal to or larger than the information transfer limit, any contrast is manifested in a micrograph according to a degree of scattering (that is, information on a specimen) caused by the specimen. However, when a specimen is observed using an electron beam that provides a spatial frequency equal to or smaller than the point resolution, since the phase of the electron beam is not correctly reproduced, an image formed does not always correctly reflect the structure of an observational entity. For example, a structure that should appear in black may appear in white.

What explicitly indicates the relationship between an observational entity and an image is a phase contrast transfer function described in, for example, "Principles and Usage of High-resolution Electron Microscope" by Shigeo Horiuchi (1988, Kyoritsu Shuppan Co., Ltd., ISBN 4-320-07123-9, P. 146). FIG. 1A shows an example. Parameters employed are an accelerating voltage that is set to 200 kV, a degree of electron beam energy dispersion that is set to $2 \times 10^{-6}$, a spherical aberration coefficient Cs that is set to 1.5 mm, a chromatic aberration coefficient Cc that is set to 2.5 mm, a focal spread Δ in the direction of the optical axis of an electron microscope caused by the chromatic aberration which is set to 8.3 nm, a degree of angular dispersion γ of an electron beam that is set to $1.0 \times 10^{-5}$ rad, and a defocus length df that is set to +73.5 nm.

The axis of abscissas of the graph indicates a spatial frequency u equivalent to the size of an observational object, and the axis of ordinates indicates an amplitude with the amplitude of an incident electron beam regarded as 1. A curve 1a represents a phase contrast transfer function that reflects even an adverse effect of spherical aberration, and vibrates to signify that when the spatial frequency u is higher than about 4.0 nm$^{-1}$, reproduction of a phase becomes incomplete. Namely, in this example, the spatial frequency u associated with a point resolution is 4.0 nm$^{-1}$, and the point resolution $d_s$ is 0.25 nm.

On the other hand, as for contrast damping phenomena derived from energy dispersion of an electron beam and angular dispersion thereof respectively, as seen from a damping curve 2a and a damping curve 3a, the former contrast damping derived from energy dispersion is dominant. Namely, even when the imperfection in a phase expressed by the curve 1a is ignored, as the structure of an observational entity gets smaller, a contrast damps. On the contrast damping curve 2a expressing the contrast damping derived from energy dispersion and the contrast damping curve 3a expressing the contrast damping derived from angular dispersion, a point at which the amplitude assumes a certain defined value (for example, 1/e where e denotes the base of a natural logarithm) shall be defined to indicate the information transfer limit. In the example of the graph, the spatial frequency u associated with the information transfer limit is 4.1 nm$^{-1}$, and a resolution of the information transfer limit $d_c$ is 0.24 nm. As mentioned above, in a conventional electron microscope, $d_s > d_c$ is established. A substantial resolution offered by the electron microscope is represented by the point resolution.

In the late 1990's, a spherical aberration corrector employing a multipole electron lens was put to practical use. When a phase shift caused by spherical aberration can be corrected, the relationship between the values of a point resolution and an information transfer limit may sometimes be reversed to be $d_s < d_c$. In this case, the information transfer limit substantially determines a resolution to be offered by an electron microscope. FIG. 1B introduces an example of a phase contrast transfer function defined under the condition. A curve 1b represents a phase contrast transfer function that reflects even an adverse effect of a spherical aberration. Compared with FIG. 1A, the spherical aberration coefficient Cs is corrected to be $15 \times 10^{-3}$ mm, and the defocus length df is set to +15.0 nm. Since the spherical aberration coefficient Cs is corrected, even when the spatial frequency u is so high as to exceed 5 nm$^{-1}$, a phase can be correctly reproduced. Moreover, unlike the curve 1a shown in FIG. 1A, the curve 1b does not vibrate relative to even high spatial frequencies. The spatial frequency u associated with a point resolution is 5.6 nm$^{-1}$, and the point resolution $d_s$ is equal to 0.18 nm.

On the other hand, since the spherical aberration alone is corrected, a damping curve 2b expressing contrast damping derived from energy dispersion does not change from the curve 2a shown in FIG. 1A. Consequently, an information transfer limit is the same as the one in the case in FIG. 1A where the spherical aberration is not corrected. The spatial frequency u associated with the information transfer limit is 4.1 nm$^{-1}$, and the information transfer limit $d_c$ is 0.24 nm.

Consequently, $d_s<d_c$ is established. In this case, a resolution offered by an electron microscope is substantially restricted by the information transfer limit. Hereinafter, if the practical use of a transmission electron microscope with an aberration corrector further prevails, the information transfer limit will be presumably noted as an index of performance determining a resolution.

Methods for measuring an information transfer limit of a transmission electron microscope includes a method of observing an amorphous thin film, which is made of carbon, germanium, or tungsten, by setting an electron microscope at a high magnification, and producing a diffractgram (that is, a light-diffracted image of a micrograph or a Fourier-transformed image thereof). Since the amorphous thin film has a random structure, it is thought to include structures exhibiting various spatial frequencies (that is, having various sizes). Namely, When the amorphous thin film is observed using the electron microscope, a spatial frequency serving as a limit of the spatial frequencies exhibited by structures correctly reflected on a formed electron micrograph is inspected.

FIG. 2A shows an example of measurement based on a diffractgram produced by a field-emission transmission electron microscope to which an accelerating voltage of 1 MV is applied. In the diffractgram, a pattern of numerous rings appears. The ring pattern is associated with the fluctuation in an amplitude plotted as the vibration of the curve 1a representing the phase contrast transfer function in FIG. 1A. Namely, it can be said that an effective signal can be sensed while being discriminated from a background such as noise within a range of frequencies within which the rings are seen. Consequently, an information transfer limit can be estimated as a frequency limit to which the rings are discerned. In the example shown in FIG. 2A, the information transfer limit is about 0.1 nm.

The merit of the method lies in that an information transfer limit can be grasped two-dimensionally. Not only the information transfer limit but also an adverse effect such as aberrations caused by a lens, mechanical vibrations, or electromagnetic noise can be discerned. For example, when a lens causes astigmatism, a circular ring pattern in a diffractgram is shown to warp in the azimuth of the astigmatism. Moreover, if the mechanical vibrations occur, the pattern decays anisotropically to reflect the directivity of the vibrations.

As an extension of the method, there is a method of observing the same position in an amorphous thin film multiple times, checking a cross-correlation between images or the dependency on a spatial frequency, and estimating an information transfer limit. Specifically, a micrograph of the same position in an amorphous thin film is double exposed on the same film with the film slightly shifted, and a diffractgram (Fourier-transformed pattern) of images resulting from the double exposure is produced. If the double-exposure images have a correlation, Young fringes being spaced by a distance corresponding to a magnitude of parallel shift, by which the film is shifted for exposures, would appear in the diffractgram.

FIG. 2B shows an example of measurement (cited from "Breaking the spherical and chromatic aberration barrier in transmission electron miscroscopy" by B. Freitag, S. Kujawa, P. M. Mul, J. Ringnaldar, and P. C. Tiemeijer (Ultramicroscopy, Vol. 102, 2005, p. 209214). A pattern of parallel stripes running from right obliquely up to left obliquely down is called Young fringes. Double-exposure images have a correlation within a range of spatial frequencies within which the Young fringes are discerned. In other words, an effective signal is considered to be sensed within the range of spatial frequencies. Consequently, an information transfer limit can be estimated. In the example shown in FIG. 2B, the information transfer limit is estimated as a limit of the range of spatial frequencies within which the fringes are discerned, that is, approximately 0.07 nm.

The measuring method does not depend on a pattern (the rings in FIG. 2A) that derives from aberrations caused by an objective lens, but can assess a specimen on the basis of the correlation between two micrographs. The measuring method is therefore suitable for assessment of an information transfer limit of a transmission electron microscope that includes a spherical aberration corrector and has the spherical aberration, which is caused by an objective lens, corrected. In reality, FIG. 2B shows the pattern formed by an electron microscope which has aberrations corrected and to which an accelerating voltage of 300 kV is applied. A ring pattern stemming from spherical aberration caused by an objective lens and being seen in FIG. 2A does not appear because the aberration has been corrected. In other words, the method adopted in the case shown in FIG. 2A cannot measure an information transfer limit of the aberration-corrected electron microscope.

The two techniques are such that an amorphous thin film is observed using an electron microscope in order to determine an information transfer limit of the electron microscope. Chromatic aberration and spherical aberration caused by an objective lens are major factors that determine an information transfer limit according to the energy dispersion and angular dispersion of an electron beam. FIG. 3 schematically shows the relationship among a specimen, the objective lens, and an enlarged image. An electron beam 4 perpendicularly incident on a specimen surface of an amorphous thin film 5 along the optical axis 30 of an electron microscope becomes a transmitted wave $g_0$, which has been transmitted by the amorphous thin film 5 that is a specimen to be observed, or scatters to become diffracted waves $g_k$ (where k denotes ±1, ±2, ±3, etc.). An image is formed on an (enlarged) image plane 8 by an objective lens 7.

In FIG. 1A and FIG. 1B, the damping curves 2a and 2b that represent contrast damping derived from energy dispersion of an electron beam and that are used to determine an information transfer limit are plotted to express a fading rate of the amplitude of an electron beam on the image formation plane 8 in relation to the spatial frequency U with the amplitude on the specimen surface of the amorphous thin film 5 as a reference. Once the amplitudes of the electron beam attained on the specimen surface of the amorphous thin film 5 and the image formation plane 8 respectively are known, a damping curve can be plotted and an information transfer limit can be determined. The amplitude on the image plane 8 can be measured because the electron beam can be observed as an enlarged image on the image plane. However, the value of the amplitude of the electron beam coming out of the specimen surface of the amorphous thin film 5 before passing through the objective lens is generally unknown.

As preconditions for use of the amorphous thin film 5, the structure of the amorphous thin film should be regarded as a random structure, and the distribution of spatial frequencies u should be regarded as being nearly continuous and uniform over a range of frequencies concerned (for example, from 1 $nm^{-1}$ to 0.1 $nm^{-1}$). The diffraction angle 2β of an electron beam on a specimen and the spatial frequency u have a relationship of $2\beta=\lambda u$ where λ denotes the wavelength of the electron beam.

Consequently, as illustratively shown in FIG. 3, the diffracted waves $g_k$ (where k denotes ±1, ±2, ±3, etc.) work like conical homogeneous continuous light, which has the light source thereof placed on a specimen surface, over an angular range that defines an area where the spatial frequencies u are regarded as being uniform, and that ends with the objective lens 7. As long as the amplitude on the side of a specimen is regarded as being constant, the diffractgram shown in FIG. 2A expresses a phase contrast transfer function as it is.

The above approximation is merely established qualitatively at a low level. In reality, even when an amorphous thin film is employed, the image thereof has a specific distribution of spatial frequencies that is not uniform because of the radii of constituent atoms. Over an area where the spatial frequencies u exceed $0.1 \text{ nm}^{-1}$, a scattering amplitude is known to rapidly fade because there is a limit to the scattering ability of constituent atoms to whatever of many atomic species the atoms belong. In other words, even when the diffractgram shown in FIG. 2A or the Young fringes shown in FIG. 2B are used to measure a contrast damping rate, the damping rate is not determined with an information transfer limit but with a variance in the quality of the amorphous thin film over a domain of frequencies equal to or larger than $0.1 \text{ nm}^{-1}$ that should be noted in the future. There is therefore a high possibility that the information transfer limit dependent on an objective lens may be incorrectly assessed.

Further, the quality of the amorphous thin film 5 adopted as a specimen to be observed counts a lot inferably from the above description. For appropriate measurement, a homogeneous film having a film thickness of several tens of nanometers or less is needed. Moreover, an internal environment of an electron microscope such as contamination of a specimen largely affects measurement. For the appropriate measurement, preparation of a specimen and maintenance of an observational environment have to be achieved carefully.

As described in relation to the related art, an information transfer limit is expected to increase the significance as an index of performance of a transmission electron microscope that determines a resolution. In the past, a diffractram expressing an amorphous thin film is produced in order to estimate a phase contrast transfer function. However, as mentioned above, the result of measurement performed according to the conventional method largely depends on the quality of the amorphous thin film to be observed. Over a domain of resolutions that are equal to or smaller than 0.1 nm and that have come to be attainable in practice because an aberration correction technology has been put to practical use, the possibility that correct assessment cannot be achieved because there is a limit to homogeneity in the quality of the amorphous thin film gets higher.

SUMMARY OF THE INVENTION

Accordingly, an object of the present invention is to provide a means for directly and quantitatively measuring an information transfer limit of a transmission electron microscope instead of semi-qualitatively measuring it using an amorphous thin film.

As described previously, in order to avoid or solve a problem that measurement depends on the quality of an amorphous thin film, a proposal is made of a method for measuring an information transfer limit by substituting a crystal thin film for the amorphous thin film and maintaining a specific diffractive condition.

FIG. 4 shows a measurement setup fundamental to a measuring method in accordance with the present invention. As a specimen for measurement, a crystal thin film 9 is substituted for the amorphous thin film 5 described in conjunction with FIG. 3. Since the crystal thin film 9 is, unlike an amorphous thin film, structured to provide a discrete spatial frequency based on a crystal lattice, when an electron beam 4 is routed to the surface of the crystal thin film 9 at an angle at which diffracted waves derived from so-called Bragg diffraction are excited, a transmitted wave $g_0$ and diffracted waves $g_1$ and $g_{-1}$ dependent on the crystal lattice are produced. In FIG. 4, the incident electron beam 4 is shown to fall perpendicularly on the surface of the crystal thin film 9. Strictly speaking, as mentioned above, the electron beam 4 falls on the surface of the crystal thin film 9 at the angle at which diffracted waves derived from the so-called Bragg diffraction are excited. When the diffracted wave $g_1$ and transmitted value $g_0$ are converged by an objective lens 7, a crystal lattice image is formed on an image plane 8. Herein, an angle $2\beta$ formed by the transmitted wave $g_0$ and diffracted wave $g_1$ shall be called a diffraction angle.

In order to make a lattice image on the image plane 8 clearer by avoiding a complex effect of multi-wave interference, an aperture system 10 that selects an intended diffracted wave alone is included on a back-focal plane of the objective lens 7 that is a diffraction plane. Specifically, the diffracted wave $g_{-1}$ that is unnecessary for measurement is eliminated by the aperture system 10 and thus excluded from image formation. In the example shown in FIG. 4, the transmitted wave $g_0$ and diffracted wave $g_1$ are selected and used to form a lattice image. The diffracted waves other than the diffracted waves $g_1$ and $g_{-1}$ are not shown. On the image plane 8, interference fringes caused by the transmitted wave $g_0$ and diffracted wave $g_1$ are formed as a lattice image. Even in the example shown in FIG. 4, although the diffracted waves other than the diffracted waves $g_1$ and $g_{-1}$ which are shown in FIG. 3 are also excited, all the diffracted waves other than the diffracted wave $g_{-1}$ are eliminated by the aperture system 10 and thus excluded from image formation.

Using the measurement setup shown in FIG. 4, measurement is performed according to a procedure shown in FIG. 5 and described below.

To begin with, a so-called achromatic condition is designated as a reference point from which the transmitted wave $g_0$ and diffracted wave $g_1$ symmetrically fall on the objective lens 7 as shown in FIG. 4. Specifically, as shown in FIG. 5A, the electron beam 4 is routed to the surface of the crystal thin film 9 at an angle at which diffracted waves derived from so-called Bragg diffraction are excited. Moreover, the surface of the crystal thin film 9 is tilted with respect to the optical axis 30 of the electron microscope so that the transmitted wave $g_0$ and diffracted wave $g_1$ will symmetrically fall on the objective lens 7. At this time, since a line indicating a half angle $\beta$ of the diffraction angle formed by the transmitted wave $g_0$ and diffracted wave $g_1$ is aligned with the optical axis, this state shall be regarded as a state in which the tilt angle $\alpha$ of the incident electron beam is zero ($\alpha=0$).

The condition is modified so that the transmitted wave $g_0$ and diffracted wave $g_1$ will sweep the objective lens 7 on a plane defined by the transmitted wave $g_0$ and diffracted wave $g_1$. Specifically, the angle which the surface of the crystal thin film 9 forms with respect to the optical axis 30 of the electron microscope is changed so that the state shown in FIG. 5A will change to the state shown in FIG. 5B or FIG. 5C. Herein, additional conditions are such that the incident electron beam should fall on the crystal thin film 9 at the angle at which diffracted waves derived from the so-called Bragg diffraction are excited, and that a condition for diffraction caused by the crystal thin film 9 should be held intact. Moreover, the aperture system 10 has to be moved while being interlocked with the movement of the transmitted wave $g_0$ and diffracted wave $g_1$ derived from a change in the angle which the surface of the crystal thin film 9 forms with respect to the optical axis 30 of the electron microscope, so that the aperture system 10 will always select the transmitted wave $g_0$ and diffracted wave $g_1$.

FIG. 5B shows a state of perpendicular incidence (zone-axis incidence) in which the electron beam 4 substantially perpendicularly falls on the surface of the crystal thin film 9. In this state, the transmitted wave $g_0$ is aligned with the optical axis 30. A line indicating a half angle of the diffraction angle formed by the transmitted wave $g_0$ and diffracted wave $g_1$ is deviated from the optical axis 30 by α. This is a state in which the tilt angle α of the incident electron beam equals β (α=β). Herein, β denotes the half angle of the diffraction angle corresponding to a distance $d_{df}$ between adjoining ones of lattice fringes.

FIG. 5C shows a state in which a line indicating the half angle of the diffraction angle formed by the transmitted $g_0$ and diffracted wave $g_1$ is deviated from the optical axis 30 by an arbitrary magnitude and the tilt angle α of the incident electron beam is arbitrary.

Thus, the objective lens 7 is swept by two electron waves of the transmitted wave $g_0$ and diffracted wave $g_1$ whose amplitudes and angular relationship are held intact.

As mentioned above, when energy dispersion of an electron beam is taken into account by causing two controlled waves to interfere with each other, the amplitude of lattice fringes formed on the image plane 8 fades to an extent increasing in sequence from the state shown in FIG. 5A through the state shown in FIG. 5B to the state shown in FIG. 5C according to the same principle as the principle of contrast damping expressed by the curve 2a or 2b shown in FIG. 1A or FIG. 1B. A cause of amplitude fading is a change in the action of the objective lens 7 on an electron beam whose energy is deconcentrated due to the chromatic aberration caused by the objective lens 7. The change in the action is expressed as changes in trajectories of electrons $g_0(V_0-v)$, $g_0(V_0)$, $g_0(V_0+v)$, $g_1(V_0-v)$, $g_1(V_0)$, and $g_1(V_0+v)$, which are separated below the objective lens 7, occurring in the states shown in FIG. 5A, FIG. 5B, and FIG. 5C.

For example, in the state shown in FIG. 5A, the objective lens 7 acts more strongly on an electron beam of an energy level $(V_0-v)$ lower than a reference energy level $(V_0)$. The trajectory of electrons $g_0(V_0-v)$ and the trajectory of electrons $g_1(V_0-v)$ intersect at a position higher than the plane surface 8. In contrast, the trajectories $g_0(V_0+v)$ and $g_1(V_0+v)$ of electron beams of an energy level $(V_0+v)$ higher than the energy level $(V_0)$ intersect at a position lower than the plane surface 8. Since electron beams of different energy levels do not interfere with each other, waves of the same energy levels tracing the trajectories $g_0(V_0-v)$ and $g_1(V_0-v)$, the trajectories $g_0(V_0)$ and $g_1(V_0)$, and the trajectories $g_0(V_0+v)$ and $g_1(V_0+v)$ interfere with each other to form lattice fringes $g_0(V_0-v)+g_1(V_0-v)$, lattice fringes $g_0(V_0)+g_1(V_0)$, and lattice fringes $g_0(V_0+v)+g_1(V_0+v)$ respectively. Lattice fringes 11 observed on the image formation plane 8 are the sum of the lattice fringes in terms of intensities. In FIG. 5A, reference symbol c denotes the amplitude of the lattice fringes.

FIG. 5A is concerned with a case where a so-called achromatic condition is satisfied and, as mentioned above, the transmitted wave $g_0$ and diffracted wave $g_1$ symmetrically fall on the objective lens 7. Due to the symmetry, the lattice fringes $g_0(V_0-v)+g_1(V_0-v)$, lattice fringes $g_0(V_0)+g_1(V_0)$, and lattice fringes $g_0(V_0+v)+g_1(V_0+v)$ formed at respective energy levels are, as indicated with a boldfaced line in the lower part of FIG. 5A, superimposed on one another while being in phase with one another. Consequently, the amplitude c of the lattice fringes 11 observed as the sum of the lattice fringes in terms of intensities is maximized.

Along with the unsatisfaction of the achromatic condition and the collapse of the symmetry between the transmitted wave $g_0$ and diffracted wave $g_1$, phase shifts of the lattice fringes $g_0(V_0-v)+g_1(V_0-v)$, lattice fringes $g_0(V_0)+g_1(V_0)$, and lattice fringes $g_0(V_0+v)+g_1(V_0+v)$ increase in the states shown in FIG. 5B and FIG. 5C. Consequently, the amplitude of the observed lattice fringes 11 fades to an extent increasing in sequence from the state shown in FIG. 5B to the state shown in FIG. 5C. When the fading in the amplitude Ψ of the lattice fringes 11 is expressed using the angle 2β formed by the transmitted wave $g_0$ and diffracted wave $g_1$ and the tilt angle α, the equation (9) below ensues.

$$\Psi = \frac{\lambda}{2\pi\Delta} \frac{\sin(2\pi\Delta\alpha\beta/\lambda)}{\alpha\beta} \qquad (9)$$

Herein, λ denotes the wavelength of an electron beam and Δ denotes a focal spread in the direction of the optical axis of an electron microscope caused by chromatic aberration. The focal spread Δ is expressed as the equation (10) below using a chromatic aberration coefficient Cc caused by an objective lens, a degree of stability $\delta V/V_0$ of an accelerating voltage, a degree of stability $\delta I/I_0$ of an objective lens exciting current, and an initial degree of energy dispersion $\delta E/V_0$ of electrons.

$$\Delta = C_c \sqrt{\left(\frac{\delta V}{V_0}\right)^2 + \left(\frac{2\delta I}{I}\right)^2 + \left(\frac{\delta E}{V_0}\right)^2} \qquad (10)$$

On the other hand, the damping curves 2a and 2b shown in FIG. 1A and FIG. 1B according to the related art are plotted by relating the amplitude, which results from the interference of a transmitted wave that has perpendicularly fallen on the objective lens, and a diffracted wave that has scattered at a scattering angle of θ=λu, to the spatial frequency u. When the amplitude indicated by each of the damping curves is formulated like the equation (9), the amplitude Φ is expressed by the equation (11) below.

$$\Phi = \frac{2\lambda}{\pi\Delta} \frac{\sin(\pi\Delta\theta^2/2\lambda)}{\theta^2} \qquad (11)$$

The equation (9) and equation (11) resemble each other. When $\theta^2$ and 4αβ are exchanged for each other, Φ and Ψ are replaced with each other.

In the equation (11), since the definition of an information transfer limit signifies that the amplitude Φ fades to 1/e (where e denotes the base of a natural logarithm). In the measurement according to the present invention, the tilt angle α at which the amplitude Ψ of lattice fringes fades to 1/e is determined. Assuming that the tilt angle is $\alpha_0$, a condition of θ=$\theta_0$ giving an information transfer limit is expressed by the equation (12) below.

$$\theta_0 = 2\sqrt{\alpha_0\beta} \qquad (12)$$

Consequently, the information transfer limit $d_c$ is provided as the equation (13) below.

$$\frac{1}{d_c} \equiv u_c = \frac{2\sqrt{\alpha_0 \beta}}{\lambda} \quad (13)$$

Otherwise, the tilt angle $\alpha_0$ and the half angle $\beta$ of a diffraction angle may be converted into wave numbers, and the information transfer limit may be estimated according to the equation (14) below.

$$u_c = 2\sqrt{u_{\alpha 0} u_\beta} \quad (14)$$

herein $$\begin{cases} u_{\alpha 0 = \alpha_0}/\lambda \\ u_\beta = \beta/\lambda \end{cases}$$

where $u_{\alpha 0} = \alpha_0/\lambda$ and $u_\beta = \beta/\lambda$ are established.

Since the diffraction angle $2\beta$ is strictly determined through diffraction caused by the crystal thin film 9, the information transfer limit $d_c$ can be defined more strictly.

Incidentally, the equations (9) and (11) are drawn out by regarding, for brevity's sake, an electron-beam energy distribution as being plotted rectangularly. For actual use of the equations (9) and (11), the equations have to be modified to take account of the energy distribution. The equation (12) is established even in consideration of the energy distribution.

A description has been made on the assumption that the transmitted wave $g_0$ and diffracted wave $g_1$ interfere with each other. However, the transmitted wave and diffracted wave may not always be used. Two diffracted waves $g_1$ and $g_2$ may be used to perform measurement in the same manner, or two diffracted waves $g_1$ and $g_{-1}$ may be used. In this case, however, the aperture system 10 should be designed to intercept the transmitted wave $g_0$. Namely, the crystal thin film 9 merely fills the role of an electron beam splitter that produces two defined electron waves.

According to the related art, since the result of measurement largely depends on a specimen, there is difficulty in highly precisely and quantitatively determining an information transfer limit. Further, when a resolution offered by an electron microscope comes to be 0.1 nm or less due to practical use of an aberration correction technology, the conventional measuring method is predicted to reach its limitations. In contrast, according to a measuring method of the present invention, an electron beam produced under a certain condition for diffraction caused by a crystal is used to perform measurement. An information transfer limit of an electron microscope can therefore be estimated highly precisely and quantitatively. Moreover, an information transfer limit of 0.1 nm or less can be measured by appropriately selecting a diffracted wave to be used for measurement. The latter point will be described below by taking a concrete example.

BRIEF DESCRIPTION OF THE DRAWINGS

These and other features, objects and advantages of the present invention will become more apparent from the following description when taken in conjunction with the accompanying drawings wherein:

FIG. 5A, FIG. 5B, and FIG. 5C are explanatory diagrams concerning the principle of measurement of an information transfer limit in accordance with the present invention;

DESCRIPTION OF THE PREFERRED EMBODIMENTS

Figure 1A:
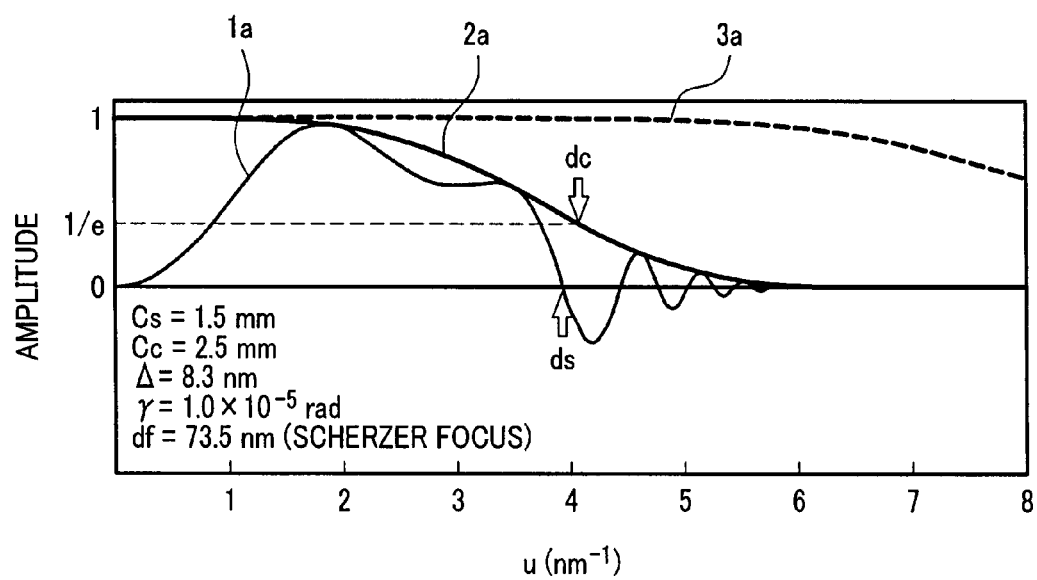
FIG. 1A and FIG. 1B are explanatory diagrams for use in explaining a resolution offered by an electron microscope by employing a phase transfer function.
Figure 1B:
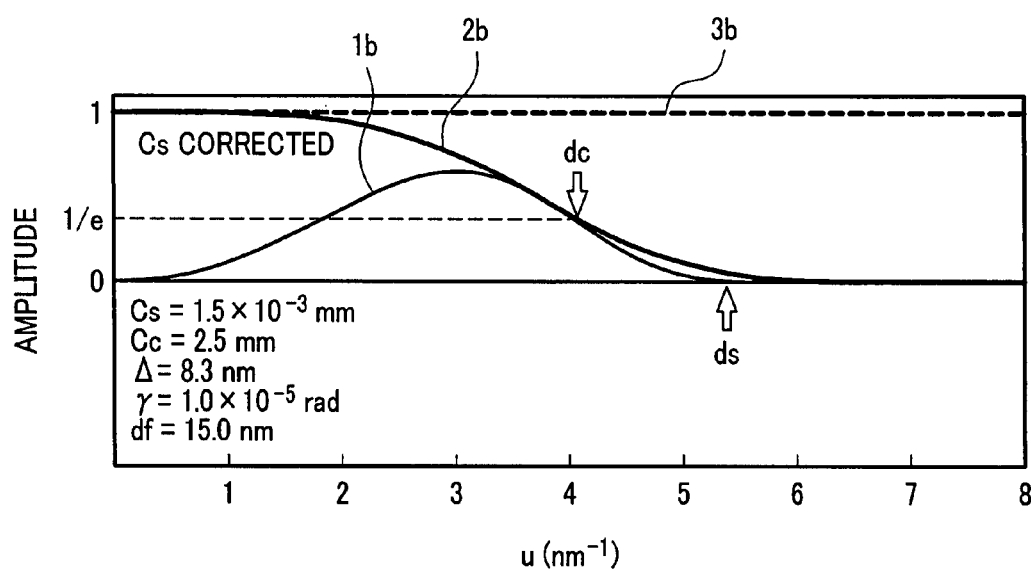
Figure 2A:
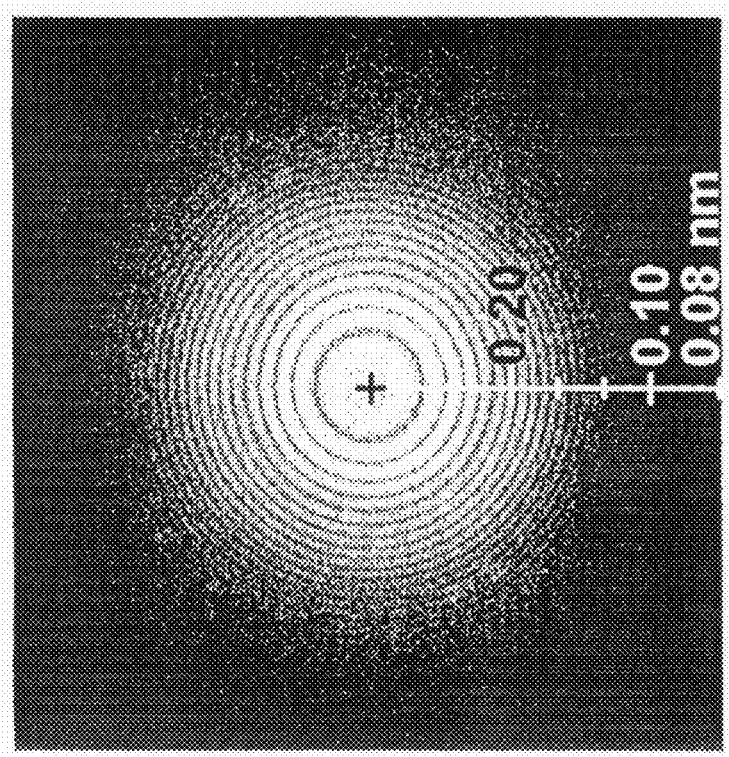
FIG. 2A and FIG. 2B show examples of conventional measurement of an information transfer limit using a diffractgram.
Figure 2B:
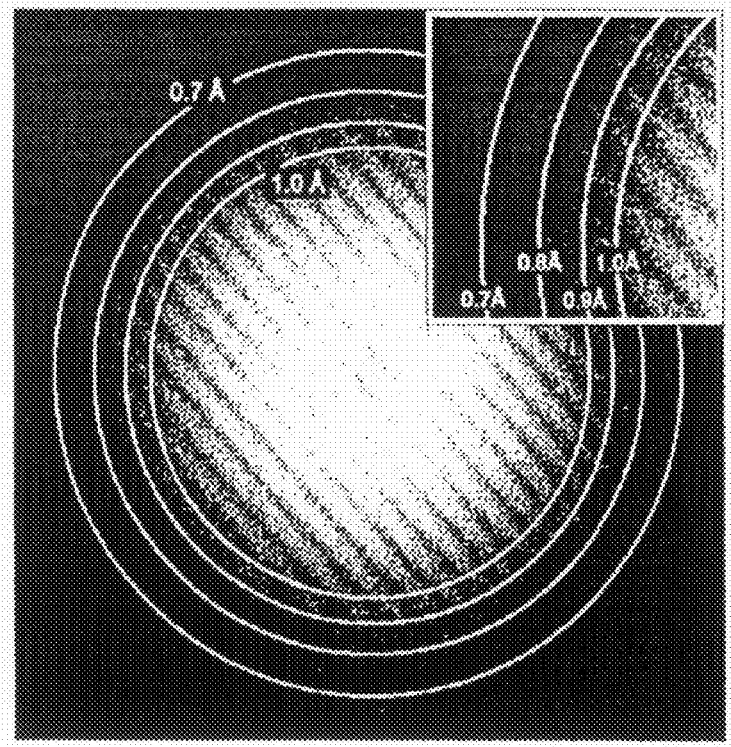
Figure 3:
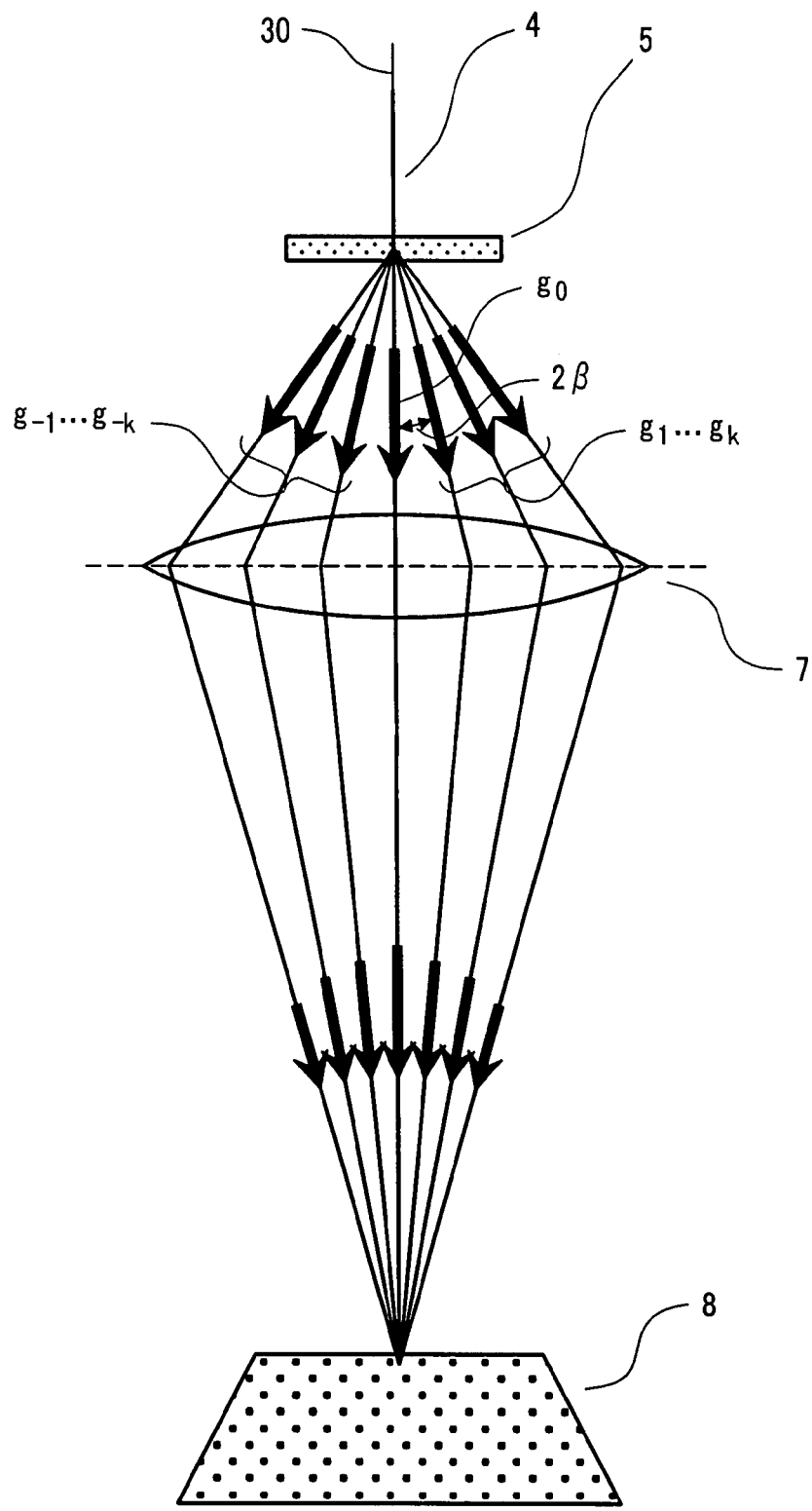
FIG. 3 is an explanatory diagram concerning a conventional information transfer limit measuring method using a diffractgram.
Figure 4:
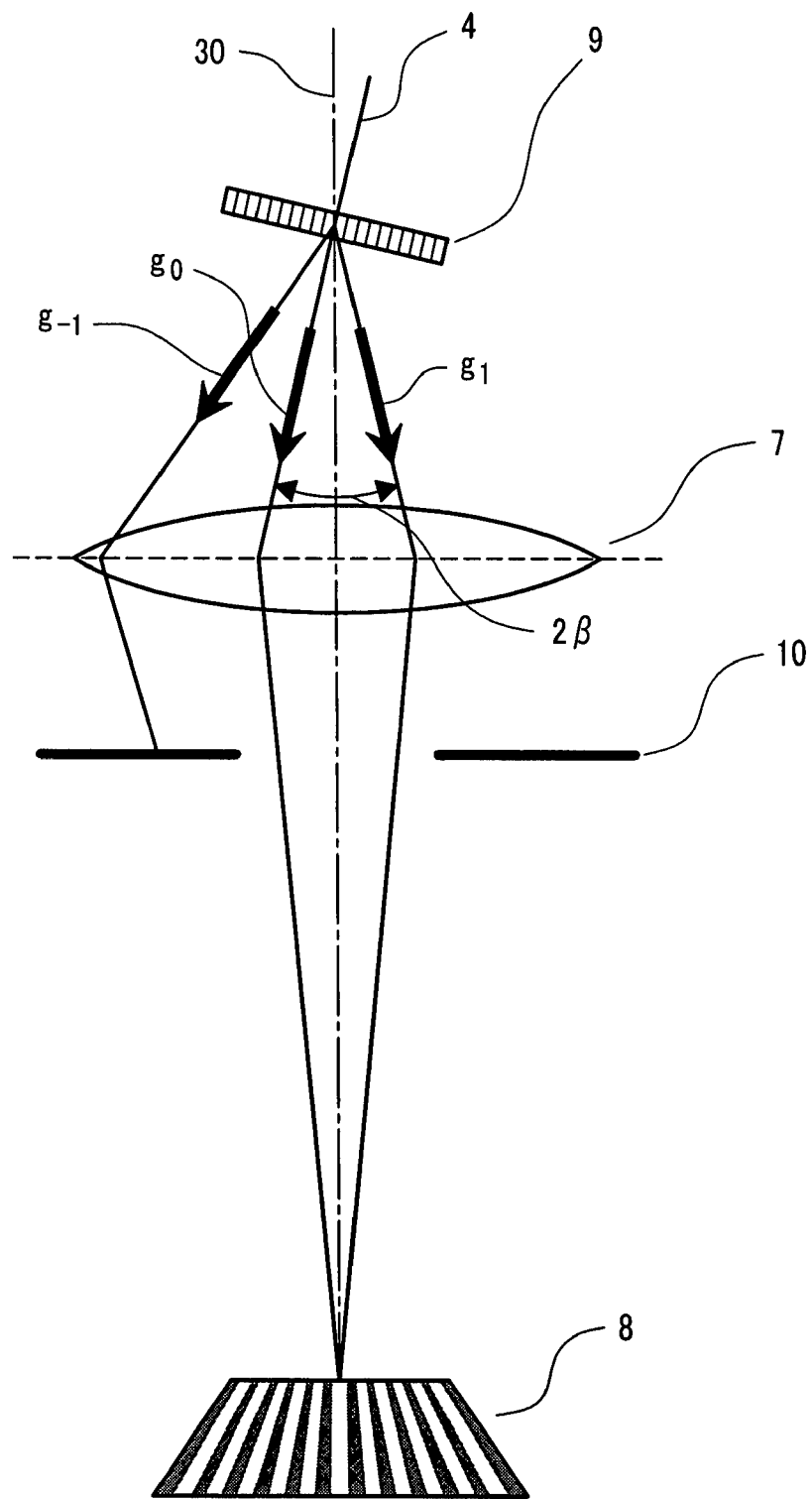
FIG. 4 is an explanatory diagram concerning production of crystal lattice fringes to be performed by utilizing diffraction caused by a crystal thin film.
Figure 6:
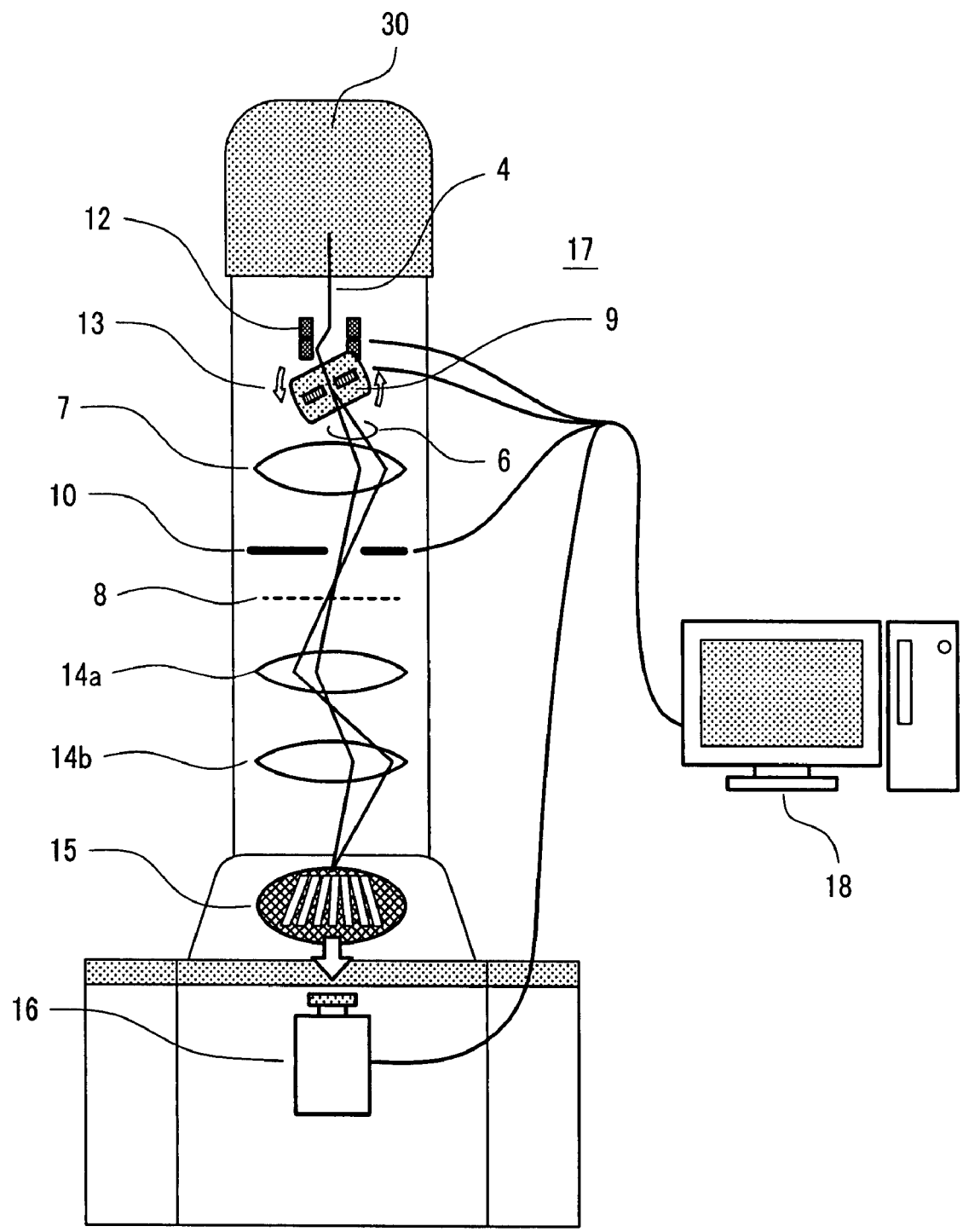
FIG. 6 shows the configuration of an electron microscope to which the information transfer limit measurement in accordance with the present invention is adapted.

FIG. 6 illustratively shows the configuration of a transmission electron microscope needed to implement measurement of an information transfer limit in accordance with the present invention. A transmission electron microscope 17 has an electron beam deflector 12 disposed above a crystal thin film 9 for the purpose of changing an incident angle at which an electron beam 4 emanating from an electron source 30 falls on the crystal thin film. Moreover, the transmission electron microscope includes a specimen tilting system 13 that adjusts the angle of a crystalline specimen itself. The electron beam 4 is scattered by the crystal thin film 9, and falls on an objective lens 7 as a diffracted electron beam 6. An aperture system 10 located below the objective lens 7 selects a diffracted wave. A lattice image is formed on an image plane 8 of the objective lens as a result of interference of the selected diffracted wave with other wave. The lattice image is enlarged by intermediate projection lenses 14a and 14b that are located below the image plane, and then projected on an observation device 15 such as a fluorescent screen. The lattice image is recorded using a recording device 16 such as a film camera or a CCD camera. Intensity is measured using the image in order to obtain an amplitude.

For measurement, while a condition for electron-beam diffraction caused by the crystal thin film 9 is held constant by the electron-beam deflector 12 and specimen tilting system 13, the electron beam 4 is swept over a diffractive plane in order to measure a change in the intensity of lattice fringes. At this time, as mentioned previously, the aperture system 10 is moved in order to follow an intended diffracted wave and thus sustain selection. This work may be performed manually. Alternatively, for example, a means for detecting a deflection angle by which an electron beam is deflected by the electron beam deflector 12, a tilt angle by which the crystal thin film 9 is tilted by the specimen tilting system 13, and the position of the aperture system 10 may be included. A control system 18 may be included for autonomously controlling, on the basis of signals sent from the means, the deflection angle by which the electron beam deflector 12 deflects an electron beam, the tilt angle by which the specimen tilting system 13 tilts the crystal thin film, and the position of the aperture system 10 so that they will have a predetermined relationship. Thus, a measuring condition may be automatically designated based on the above condition. Moreover, if necessary, the control system 18 may be designed to autonomously control imaging to be performed by a camera 16 that is the recording device.

Referring to FIG. 7, a concrete measuring procedure will be described below. The crystal thin film 9 to be employed for measurement may be a crystalline thin film. However, a gold single crystal thin film that is often adopted as a standard specimen for electron microscopes would be preferable due to the merits described below.

(1) A high-quality single crystal thin film can be readily produced.

(2) A constituent element is heavy enough to provide satisfactory scattering.

(3) A structure is relatively simple, and a complex diffracted wave is not excited.

(4) The structure is stable.

Figure 7A:
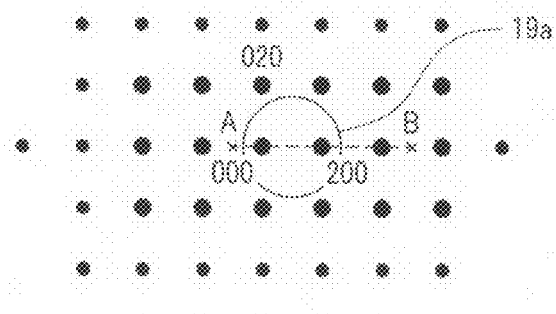
FIG. 7A, FIG. 7B, and FIG. 7C show an example of application of the information transfer limit measurement in accordance with the present invention.
Figure 7B:
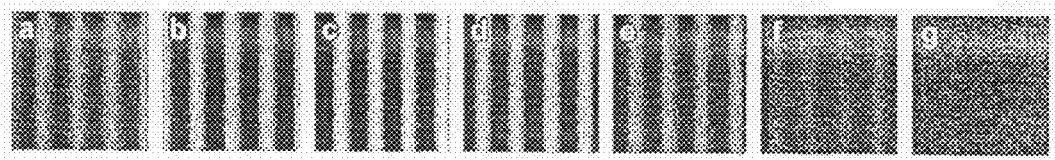
Figure 7C:
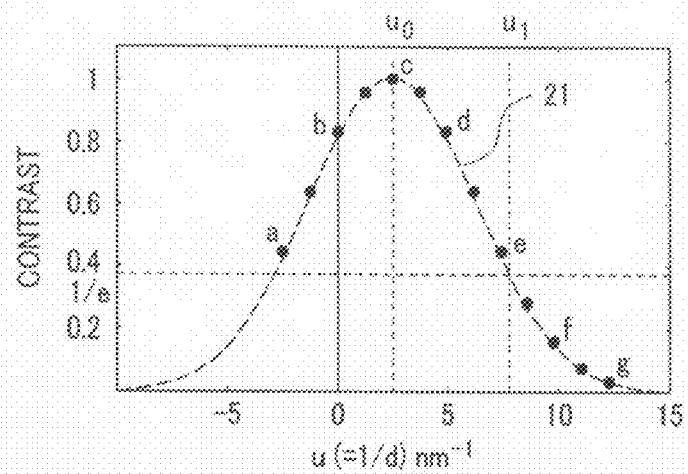

In the example shown in FIG. 7A to FIG. 7C, an Au (001) film is employed.

To begin with, as mentioned above, two waves to be caused to interfere with each other are selected in order to avoid the complexity in diffraction of multiple waves. In FIG. 7A, reference numeral 19 denotes an electron diffraction pattern illustratively shown as a pattern produced by routing an electron beam perpendicularly to the Au(001) film (namely, in a [100] azimuth). Black dots arrayed in the form of a lattice represent spots of transmitted waves and diffracted waves. A circle 19a indicates an aperture stop to be used to select a diffracted wave. Hereinafter, two waves 000 (transmitted wave) and 200 (diffracted wave) shall be selected by the aperture stop 19a, and the other diffracted waves shall be intercepted. As an aperture system that selects the diffracted wave, an objective aperture included in an ordinary transmission electron microscope may be adopted. For selection of two proper waves, the aperture stop may not necessarily be circular but may be oblong or rectangular. Otherwise, the use of two aperture stops may be sometimes advantageous. As long as an information transfer limit is almost known, appropriate relative diffraction vectors $g_0$ and $g_1$ may be estimated according to the equation (12) and taken into consideration in order to select two waves employed.

In the example shown in FIG. 7A to FIG. 7C, the lattice fringes formed by the transmitted wave 000 and diffracted wave 200 result from interference of the two waves. Therefore, the lattice fringes are parallel fringes exhibiting, as shown in FIG. 7B, a sinusoidal change in the intensity thereof. Noted is that FIG. 7B shows lattice images produced by performing simulation according to a multi-slice method.

As mentioned above, while a pair of a diffracted wave and other wave to be selected and a condition for diffraction caused by the crystal thin film are held intact, when an incident angle at which an electron beam is incident on the objective lens 7 is changed, the contrast of the fringes changes as shown in a to g in FIG. 7B. The change in the incident angle refers to the movement of an optical center such as a voltage center of an accelerating voltage, which is applied to the electron microscope, from a point A to a point B in the electron diffraction pattern 19 shown in FIG. 7A. In this case, a measurer can select either of the methods described below.

(1) While the movement in the electron diffraction pattern is observed, the tile angle α of an incident electron beam is determined appropriately. The lattice fringes a to g associated with the determined angles are obtained.

(2) After an appropriate optical center such as a voltage center of an accelerating voltage to be applied to the electron microscope is determined in the electron diffraction pattern, while the tilt angle of an incident electron beam is changed, the lattice fringes a to g associated with the changed angles are obtained.

In either of the methods, according to the principle of measurement, the aperture stop 19a has to be moved along with the movement of the electron diffraction pattern so that selection of a diffracted wave will be sustained. Moreover, the crystal thin film 9 has to be tilted in line with the tilt angle of the incident electron beam 4 so that a condition for diffraction caused by the crystal thin film 9 will be held intact.

A contrast of formed lattice fringes is defined as the equation (15) and plotted by linking the values of the tilt angle of the incident electron beam 4. This results in a characteristic curve 21 shown in the graph of FIG. 7C.

$$C = \frac{I_{max} - I_{min}}{I_{max} + I_{min}} \quad (15)$$

Herein, $I_{max}$ denotes the maximum intensity of lattice fringes, and $I_{min}$ denotes the minimum intensity thereof. The axis of abscissas of the graph of FIG. 7C indicates a wave number $u=\lambda\alpha$ in a reciprocal space that represents an incident angle. Black dots a to g on the characteristic curve 21 in the graph are associated with measured electron micrographs a to g shown in FIG. 7B. Moreover, a peak c of the characteristic curve 21 in the graph of FIG. 7C indicates an achromatic condition that should be regarded as a reference.

According to one of the methods, the graph is directly checked in order to assess damping of a contrast of lattice fringes. The wave number u associated with the contrast of 1/e is estimated, and an information transfer limit is obtained using the equations (16) to (18). For example, in the example of the characteristic curve 21 in the graph of FIG. 7C, assuming that $u_0$ and $u_1$ denote the wave numbers representing a contrast attainable under the achromatic condition and a damped contrast of 1/e, the equations (16) below are obtained.

$$\left. \begin{array}{l} u_0 = 2.46 \, \text{nm}^{-1} \\ u_1 = 7.90 \, \text{nm}^{-1} \\ u_{\alpha 0} = u_1 - u_0 = 5.44 \, \text{nm}^{-1} \end{array} \right\} \quad (16)$$

Since $\beta(u_\beta)$ is defined as a half angle of a diffraction angle, the equation (17) below is drawn out.

$$u_\beta = \frac{|g_{200} - g_{000}|}{2} = 2.46 \, \text{nm}^{-1} \quad (17)$$

Consequently, using the equation (14), the information transfer limit is expressed by the equation (18) below.

$$d_c = \frac{1}{u_c} = \frac{1}{2\sqrt{u_{\alpha 0} u_\beta}} = 0.137 \, \text{nm} \quad (18)$$

However, according to this method, a contrast of lattice fringes has to be assessed based on a damped contrast value. There is therefore a possibility that an error may be large.

According to the other method, an appropriate function is fitted to the damping in a contrast within a range of contrasts which are satisfactory to lattice fringes. The function corresponds to the equation (11). For the fitting, a function defined in consideration of an electron-beam energy distribution that is ignored in definition of the equations (9) and (11) should be employed. When consideration is taken into the energy distribution, the equations (9) and (11) are rewritten as envelope functions expressed by the equations (19) and (20) respectively.

$$\tilde{\Psi}(u) = \exp\left(-\frac{1}{2}\pi^2\Delta^2\lambda^2 u^4\right) \qquad (19)$$

$$\tilde{\Phi}(u_{\alpha 0}) = \tilde{\Psi}(2\sqrt{u_{\alpha 0}u_\beta}) = \exp(-8\pi^2\Delta^2\lambda^2 u_{\alpha 0}^2 u_\beta^2) \qquad (20)$$

Herein, λ denotes the wavelength of an electron beam, and Δ denotes a focal spread. The focal spread Δ is regarded as an indeterminate parameter, and the equation (20) is fitted to the points in the graph of FIG. 7C. Consequently, the focal spread Δ=4.31 nm is obtained.

The fitting curve is drawn with a dashed line 21 in the graph of FIG. 7C.

When it comes to an information transfer limit, since the equation (19) may be rewritten into the equation (21) below, the equation (22) below can be drawn out.

$$\tilde{\Psi}(u) = 1/e \qquad (21)$$

$$d_c = \sqrt{\frac{\pi\Delta\lambda}{\sqrt{2}}} = 0.138\,\text{nm} \qquad (22)$$

According to either of the above methods, an information transfer limit can be determined based on the present invention.

Implementation of the present invention poses a problem in that the objective lens 7 has to be swept with a condition for diffraction, which is caused by a specimen crystal thin film, held constant. In order to estimate a correct information limit according to the present invention, a change of a diffracted wave to be excited due to a shift in an angle of a crystal with respect to an incident electron beam, a change in the thickness of the crystal thin film derived from a shift of an observational position, or a change in the contrast of lattice fringes caused by a change in the condition for diffraction by the crystal thin film has to be avoided. There is difficulty in strictly avoiding the change locally in an observational area. Even in this case, since the crystal thin film generally has finite sag, it is presumably possible to select a subarea, over which the same condition for diffraction is established, from the observational area. For example, when a contrast changes abruptly because of a slight shift of an observed position on the objective lens 7 that is swept, the position of the specimen crystal thin film is a bit changed in order to obtain lattice fringes exhibiting a higher contrast. Measurement with a condition for diffraction held almost intact is expected to be achieved.

The present invention attempts to clarify a method for measuring an information transfer limit of a transmission electron microscope. The information transfer limit capable of being measured according to the present invention is an index of performance that determines a resolution to be offered by the transmission electron microscope. In particular, in a situation in which a limit of a resolution determined with an aberration caused by a lens such as a spherical aberration is expected to be relaxed along with the prevalence of an aberration correction technology, the information transfer limit would substantially determine a resolution offered by an electron microscope.

What is claimed is:

1. A method for measuring an information transfer limit of a transmission electron microscope by adopting a crystal thin film, of which lattice constants and structure are known, as a specimen to be assessed, and measuring a contrast of observed crystal lattice fringes, wherein:

an electron beam is routed to the crystal thin film;

two specific waves of the electron beam that are transmitted or diffracted are selected and used to form a lattice image; and while a condition for diffraction of the electron beam to be caused by the specimen, and a condition for selection of the two transmitted or diffracted waves are held intact, a change in the contrast of formed crystal lattice fringes derived from a change in the incident angle of the electron beam falling on the crystal thin film is checked in order to measure the information transfer limit.

2. The method for measuring an information transfer limit according to claim 1, wherein:

the incident angle of the electron beam is changed in order to determine the tilt angle $\alpha_0$ of the incident electron beam, at which the contrast of crystal lattice fringes is 1/e under an achromatic condition satisfied by the two waves of the electron beam, or an associated wave number $u_{\alpha 0}=\alpha_0/\lambda$;

a half angle β of a diffraction angle corresponding to a distance $d_{df}$ between adjoining ones of lattice fringes, or a wave number $u_\beta$ is represented by an equation (1) below;

$$u_\beta = \frac{1}{d_{df}} = \frac{\beta}{2\lambda} \qquad (1)$$

using the equation (1), an information transfer limit $d_c$ is provided as the equation (2):

$$d_c = \frac{\lambda}{2\sqrt{\theta_0\beta}} = \frac{1}{2\sqrt{u_{\alpha_0}u_\beta}} \qquad (2)$$

where e denotes the base of a natural logarithm and λ denotes the wavelength of an electron beam.

3. The method for measuring an information transfer limit according to claim 1, wherein:

the incident angle of the electron beam is changed in order to fit the equation (3), which is a function encompassing a focal spread Δ that is an indeterminate constant, to a change in the contrast of lattice fringes derived from a change in the tilt angle α of the incident electron beam or in an associated wave number $u_\alpha=\alpha/\lambda$;

$$\tilde{\Phi}(u_\theta) = \exp(-8\pi^2\Delta^2\lambda^2 u_\theta^2 u_\beta^2) \qquad (3)$$

the focal spread Δ that is an indeterminate constant is thus determined; and an information transfer function $d_c$ is provided as the following equation (4):

$$d_c = \sqrt{\frac{\pi \Delta \lambda}{\sqrt{2}}} \quad (4)$$

where $u_\beta$ denotes a wave number ($=1/d_{df}$) relevant to a distance $d_{df}$ between adjoining ones of lattice fringes employed for measurement, and $\lambda$ denotes the wavelength of the electron beam.

4. The method for measuring an information transfer limit according to claim 1, wherein the condition for diffraction of the electron beam is a condition that diffracted waves derived from the so-called Bragg diffraction is excited.

5. A transmission electron microscope, comprising:

an electron source;

a crystal thin film to which an electron beam radiated from the electron source is routed;

an electron beam deflector disposed on the side of the electron source beyond the crystal thin film in order to change the angle of the electron beam incident on the crystal thin film;

a specimen tilting system that adjusts the angle of the crystal specimen with respect to the optical axis of the electron microscope;

an objective lens on which a diffracted electron beam scattered by the crystal thin film falls;

an aperture system which is disposed on an opposite side of the objective lens relative to the electron source, which selects the diffracted electron beam, and whose position can be varied depending on the angle of the electron beam incident on the crystal thin film; and an observation device for use in observing a lattice image that results from interference of the selected diffracted wave and other wave and that is formed on an image plane of the objective lens, wherein:

a crystal thin film whose lattice constants and structure are known is adopted as a specimen to be assessed, a contrast of crystal lattice fringes to be observed is measured in order to measure an information transfer limit of the transmission electron microscope, an electron beam is routed to the crystal thin film, two specific waves of the electron beam that are transmitted or diffracted are selected and used to form a lattice image, and while a condition for diffraction of an electron beam caused by the specimen and a condition for selection of the two transmitted or diffracted waves are held intact, the incident angle of the electron beam falling on the crystal thin film is changed in order to check a change in the contrast of formed crystal lattice fringes for the purpose of measuring an information transfer limit, and wherein:

the incident angle of the electron beam is changed in order to determine the tilt angle $\alpha_0$ of the incident electron beam, at which the contrast of crystal lattice fringes is 1/e under an achromatic condition satisfied by the two selected waves of the electron beam, or an associated wave number $u_{\alpha 0} = \alpha_0/\lambda$, a half angle $\beta$ of a diffraction angle corresponding to a distance $d_{df}$ between adjoining ones of lattice fringes, or an associated wave number $u_\beta$ is represented by the equation (5) below:

$$u_\beta = \frac{1}{d_{df}} = \frac{\beta}{2\lambda} \quad (5)$$

using the equation (5), an information transfer limit $d_c$ is provided as the following equation (6):

$$d_c = \frac{\lambda}{2\sqrt{\theta_0 \beta}} = \frac{1}{2\sqrt{u_{\theta_0} u_\beta}} \quad (6)$$

where e denotes the base of a natural logarithm and $\lambda$ denotes the wavelength of the electron beam.

6. The transmission electron microscope according to claim 5, further comprising a control system that controls the electron beam deflector, specimen tilting system, and aperture system while interlocking them with one another.

7. A transmission electron microscope, comprising:

an electron source;

a crystal thin film to which an electron beam radiated from the electron source is routed;

an electron beam deflector disposed on the side of the electron source beyond the crystal thin film in order to change the angle of the electron beam incident on the crystal thin film;

a specimen tilting system that adjusts the angle of the crystal specimen with respect to the optical axis of the electron microscope;

an objective lens on which a diffracted electron beam scattered by the crystal thin film falls;

an aperture system which is disposed on an opposite side of the objective lens relative to the electron source, which selects the diffracted electron beam, and whose position can be varied depending on the angle of the electron beam incident on the crystal thin film; and an observation device for use in observing a lattice image that results from interference of the selected diffracted wave and other wave and that is formed on an image plane of the objective lens, wherein:

a crystal thin film whose lattice constants and structure are known is adopted as a specimen to be assessed, a contrast of crystal lattice fringes to be observed is measured in order to measure an information transfer limit of the transmission electron microscope, an electron beam is routed to the crystal thin film, two specific waves of the electron beam that are transmitted or diffracted are selected and used to form a lattice image, and while a condition for diffraction of an electron beam caused by the specimen and a condition for selection of the two transmitted or diffracted waves are held intact, the incident angle of the electron beam falling on the crystal thin film is changed in order to check a change in the contrast of formed crystal lattice fringes for the purpose of measuring an information transfer limit, and wherein:

the incident angle of the electron beam is changed in order to fit the equation (7) below, which is a function encompassing a focal spread $\Delta$ that is an indeterminate constant, to a change in the contrast of lattice fringes derived from a change in the tilt angle $\alpha$ of the incident electron beam or in an associated wave number $u_\alpha = \alpha/\lambda$, $$\tilde{\Phi}(u_\theta) = \exp(-8\pi^2 \Delta^2 \lambda^2 u_\theta^2 u_\beta^2) \quad (7)$$

the focal spread Δ that is an indeterminate constant is thus determined, and an information transfer limit $d_c$ is provided as the following equation (8):

$$d_c = \sqrt{\frac{\pi \Delta \lambda}{\sqrt{2}}} \qquad (8)$$

where $u_\beta$ denotes a wave number ($1/d_{df}$) relevant to a distance $d_{df}$ between adjoining ones of lattice fringes employed for measurement, and λ denotes the wavelength of the electron beam.

8. A transmission electron microscope comprising:

an electron source generating a electron beam;

an electron beam deflector between the electron source and a specimen in order to change an angle of the electron beam incident on the specimen;

a specimen-holding device which supports the specimen and possesses mechanism to tilt the specimen;

an objective lens on which a diffracted electron beam of the electron beam scattered by a crystal thin film falls;

an aperture system positioned below the specimen to select specified transmitted or diffracted electron beams;

an observation device to observe an image on an image plane of the objective lens that results from interference of the selected electron beams; and a control system which controls the specimen-tilt to keep the angle between the specimen and the electron beam incident to the specimen to be constant, and the aperture position to track the selected electron beams, while the angle of the electron beam incident to the specimen is changed, wherein when the specimen is a crystal thin film with known crystal structure and lattice constant, the angle of the electron beam incident on the specimen is changed in order to check a change in a contrast of formed crystal lattice fringes on the image plane for purpose of measuring an information transfer limit.

9. The transmission electron microscope according to claim 8, wherein the angle between the specimen and the electron beam incident to the specimen is an angle at which diffracted waves of the diffracted electron beam derived from the so-called Bragg diffraction are excited.

* * * * *